US007061258B2

(12) United States Patent
Degani et al.

(10) Patent No.: US 7,061,258 B2
(45) Date of Patent: Jun. 13, 2006

(54) TESTING INTEGRATED CIRCUITS

(75) Inventors: Yinon Degani, Highland Park, NJ (US); Charley Chunlei Gao, Plano, TX (US); King Lien Tai, Berkeley Heights, NJ (US)

(73) Assignee: Sychip Inc., Plano, TX (US)

( * ) Notice: Subject to any disclaimer, the term of this patent is extended or adjusted under 35 U.S.C. 154(b) by 0 days.

(21) Appl. No.: 10/997,629

(22) Filed: Nov. 24, 2004

(65) Prior Publication Data

US 2005/0088194 A1 Apr. 28, 2005

Related U.S. Application Data

(62) Division of application No. 10/053,818, filed on Jan. 22, 2002, now Pat. No. 6,867,607.

(51) Int. Cl.
*G01R 31/02* (2006.01)

(52) U.S. Cl. ...................................... 324/754; 324/761

(58) Field of Classification Search ........ 324/754–762, 324/765, 537; 439/480–482, 824; 438/14–18
See application file for complete search history.

(56) References Cited

U.S. PATENT DOCUMENTS 4,649,339 A * 3/1987 Grangroth et al. .......... 324/537

* cited by examiner

*Primary Examiner*—Vinh P. Nguyen
(74) *Attorney, Agent, or Firm*—Peter V. D. Wilde

(57) ABSTRACT

A flexible membrane test apparatus and test method for high-speed IC chips. The method and apparatus rely on locating the reference components of the test circuit very close to the contact pads of the IC chip under test. This is achieved in one embodiment by locating those components adjacent to the flexible membrane. In another embodiment, the reference components may be attached to the membrane itself, so the length of the runners connecting the contact points of the tester and the critical reference components is optimally reduced. In yet a further embodiment, the entire test circuit, in the form of an IC test chip, is located on the membrane.

10 Claims, 3 Drawing Sheets

32
33
26

32
32
44
44
45
45

52
52
51
51

TESTING INTEGRATED CIRCUITS

RELATED APPLICATION

This application is a division of application Ser. No. 10/053,818, filed Jan. 22, 2002, now U.S. Pat. No. 6,867,607.

FIELD OF THE INVENTION

This invention relates to apparatus and methods for testing semiconductor integrated circuit (IC) devices, and more specifically to testing high speed IC devices.

BACKGROUND OF THE INVENTION

In Multi-Chip-Module (MCM) packaging, test strategy is especially critical. Testing the final product, the conventional approach generally favored from the standpoint of both cost and reliability, is not optimum for MCM products since the final yield is a multiple of the yield for each individual die in the MCM package. For example, if each of the dies in the package has a yield of 95%, an MCM with 3 dies will have a yield of only 85.7%. Thus in some IC device packaging, notably MCM packaging, it becomes important to fully test the dies before assembly to identify the Known Good Dies (KGD).

Electrical testing of IC devices is a significant component of the cost of the final IC product. Thus, significant effort and expense is devoted to testing techniques and testing equipment. Testing of semiconductor IC devices is typically conducted using probe cards. This type of test equipment is highly developed and widely used. However, as the pitch of IC devices shrinks, it becomes difficult to reliably access the contact pads on the device. Parasitics of the contact such as the inductance of the probes can distort the measurement particularly with high speed RF ICs. Improvements in test equipment for IC chips have been made. A recent example is the so-called membrane tester described in U.S. Pat. No. 6,307,387, issued Oct. 31, 2001, parts of which are incorporated herein for an understanding of this invention, and all of which is incorporated by reference for additional details of this apparatus.

Membrane test instruments that are currently available for testing IC devices perform well for most digital IC devices, but are less effective for testing high speed analog IC devices, such as state of the art RF devices. Detecting errors in digital devices typically requires only sensing two voltage levels, $V_{DD}$ and $V_{SS}$. Analog device testing is more demanding, and requires more efficient and sensitive test circuits. For the purpose of describing the invention as applied to IC devices in general, high-speed IC devices are those that process signals above 100 MHz.

A variety of test strategies are used in the IC industry. Preliminary tests at the wafer level may be performed to identify chips that pass DC and parametric tests, but testing the total functionality is often reserved until the IC device is singulated, and sometimes until the device is packaged. The DC and parametric tests cannot fully characterize the IC. It would be obviously desirable to perform full functional tests of RF chips at the wafer level, but that has been only marginally satisfactory using prior art test apparatus. Performing fully functional tests requires a test circuit that replicates the functions of the IC chip being tested. Input stimulants are applied to the chip under test and the electrical responses are compared with the reference test circuit to determine correlation. In typical prior art test apparatus, the reference circuits are necessarily located physically at a point removed from the device under test. Consequently, the electrical signals must travel significant lengths to the reference circuit. Getting signals in and out of an IC chip at high frequency is usually limited by the parasitic and the mismatch of the impedance of the lines that carry the signal and the I/O port of the IC. This impedance mismatch causes reflections of signals that translate to distorted signals and power loss. The mismatch impedance is addressed in the system level by assembling impedance matching elements (L,C) in close proximity to the I/Os of the IC chip thus matching the I/O impedance to the signal line impedance. However, this solution is not applicable in conventional probe testing due to the large distance between the probe contact point and the reference elements.

In summary, the relative remoteness between the IC device under test and the reference circuit components causes impairment of the test signals, particularly for high-speed RF signals.

Similar challenges are presented in testing high speed digital IC devices. Very dense memory IC chips are most reliably tested when the test address signals have short electrical paths.

STATEMENT OF THE INVENTION

We have developed a test apparatus and a test method for full functionality testing of high-speed IC devices at the wafer level. The method and apparatus rely on locating critical components of the reference circuit very close to the contact pads of the IC chip under test. This is achieved in one embodiment by locating those components adjacent to the probe membrane. In another embodiment, test components may be attached to the membrane itself, so the length of the runners connecting the contact points of the tester and the critical test components is optimally reduced. This results in reduction of the parasitics of the components, and the interconnection between the test components and the IC under test becomes a lumped element rather than a transmission line, and no matching circuits are required. In this embodiment, the reference components may be in discrete form or, preferably, integrated on a silicon or ceramic chip. In yet a further embodiment, the entire test circuit, in the form of an IC test chip is located on the membrane.

In the preferred embodiment of the invention, the IC chips under test are high speed analog devices, and the critical reference components are L,C components. Use of the test apparatus of the invention allows full system testing of high speed analog IC devices at the wafer level.

These and other aspects of the invention may be more fully understood from the following detailed description taken with the drawing.

DETAILED DESCRIPTION

For the purpose of this exposition, reference IC devices are those associated with the test apparatus, i.e. the standard devices against which the devices under test are compared, while the device being evaluated is referred to as the device under test. For the purpose of the detailed description, the IC chip under test is an analog device. However, it will be understood that the invention applies also to testing other forms of IC devices, including high speed digital devices.

High frequency RF devices under test will normally comprise active devices, such as transistors, and passive devices, such as capacitors, inductors, and balum transformers. The passive devices are typically combined in LC subcircuits for matching, and for tank circuits. The IC device under test may be a fully integrated IC, or a hybrid IC. The wafer being tested may comprise fully integrated IC chips, a silicon substrate with integrated passive circuits, or may be hybrid IC combinations formed on a silicon wafer platform. It may also be a silicon on silicon multichip module. The corresponding reference ICs will have equivalent subcircuits or elements. The IC device under test may also have both digital and analog on the same IC chip, for example, logic functions and memory devices may be integrated on the same chip. An effective IC test apparatus is designed to accommodate all these variations.

Figure 1:
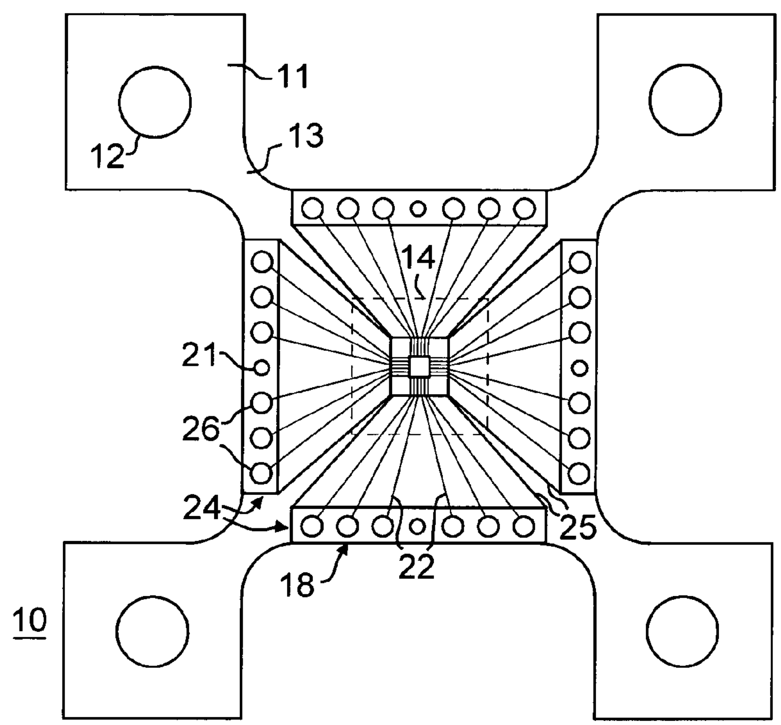
FIG. 1 is a schematic plan view of a portion of a prior art membrane IC test apparatus.

Referring to FIG. 1, a membrane test apparatus similar to that shown and described in U.S. Pat. No. 6,307,387, issued Oct. 31, 2001 is illustrated as an example of a membrane tester that may be modified in accordance with the invention. For details of the other parts of the apparatus reference may be made to the patent. The part shown, i.e. the flexible membrane assembly is the critical part of the apparatus and the part that may be modified according to the invention.

It will be evident to those skilled in the art that the elements shown in these figures are not necessarily drawn to scale. Certain elements are shown exaggerated in size for clarity.

Figure 2:
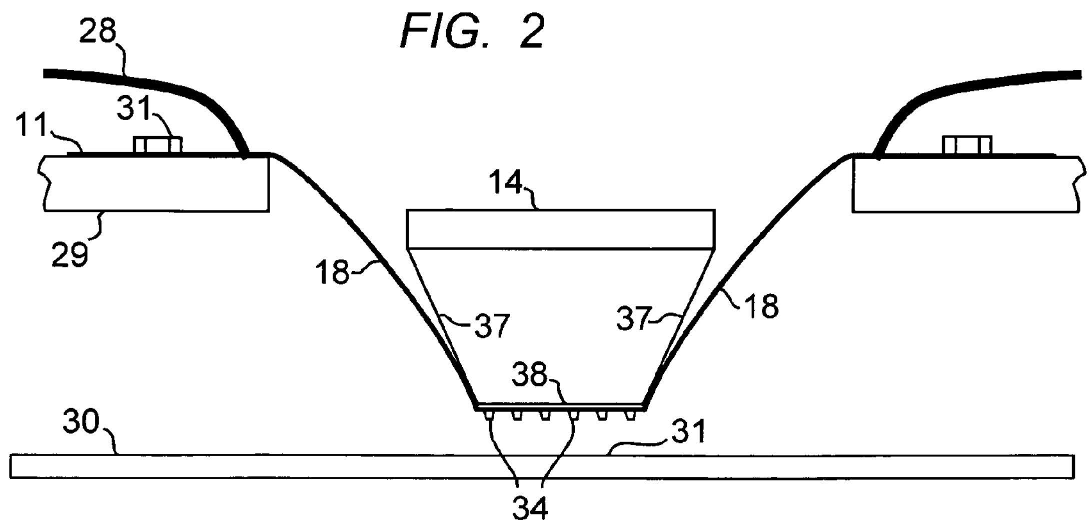
FIG. 2 is a view of the apparatus of FIG. 1 showing the center portion in greater detail.

FIGS. 1 and 2 show a membrane probe assembly 10 with arms 11 for attaching the membrane to a frame, for example, frame 29 shown in FIG. 2. The membrane probe is attached by screws 31 (FIG. 2) through holes 12 (FIG. 1)

To measure the electrical performance of a particular die area 31 on the silicon wafer 30, high-speed digital lines and/or shielded transmission lines 28 of the probe head are connected to the I/O ports of the test instrument by a suitable cable assembly, and the chuck which supports the wafer is moved in mutually perpendicular X,Y,Z directions in order to bring the pads of the die area into alignment with the contacts 34 on the lower contacting portion of the membrane probing assembly.

The probe head includes a probe card with data/signal lines that selectively interconnect terminals 26 with the I/O cable 28. The probe card is attached to the support structure 29 by means of screws 31.

Also attached to the support structure is a movable plunger 14 that projects from the base of support as shown. The plunger has angled sides 37 that converge toward a flat surface 38 so as to give the plunger the shape of a truncated pyramid. The flexible membrane 18 is attached to the support 29 and aligned to the support by means of alignment pins 21 included on the support. This flexible membrane assembly is formed by one or more plies of insulative sheeting such as KAPTON® sold by E.I. Du Pont de Nemours or other polyimide film, and flexible conductive layers or strips are provided between or on these plies to form the data/signal lines 22. The I/O lines 22 on the flexible membrane connect the probe array 34 with terminals 26.

When the plunger 14 is activated, i.e. depressed, as shown in FIG. 2, the plunger protrudes through the opening in the probe card and urges the probe contact array 34 onto the wafer 32 under test. It will be noted that the probe contact array as shown is essentially square, and is shown with six probe contacts per side. The number and arrangement of probe contacts is selected to correspond to the contact pad array on the IC chip under test. In this example, the IC chip under test would have an edge array of contact pads, six on each side. More typically, there are tens of contact pads per side. The IC chip may be approximately square, as in the example shown, or rectangular. A 40×60 edge pad array is more typical than that illustrated. Area contact pad arrays may also be tested with the apparatus shown. The routing of the address lines is more complex for an IC device with an area array of I/O contacts. Space is provided between edge contact pads for address lines to the interior pads. Although more complex, the apparatus is easily adapted for this application. Depending on the contact pad arrangement on the device under test, a suitable membrane will be installed in the test apparatus. Interchangeable membranes are easily mounted in the apparatus. Alignment pins 21 (FIG. 1) aid in mounting the interchangeable membranes.

The figures show a mechanical plunger for depressing the membrane and urging the test contact array into contact with the IC chip under test. Other arrangements for achieving equivalent results are also possible. For example, the membrane may be depressed using compressed air, magnetic fields, etc.

The electrical test procedure itself is conventional and comprises the steps of applying test voltages to the test array, measuring the test voltages, comparing the measured test voltages to a set of predetermined IC device voltages, and selecting those IC devices with test voltages that meet said set of predetermined IC device voltages for final assembly, i.e. bonding the IC device to a permanent interconnection substrate. As will be understood by those skilled in the art the steps of measuring, comparing and selecting are carried out by automated software driven means.

A full functional test as that term is used in the art means a test that evaluates all of the essential chip functions, and is the final test used for identifying Known Good Die (KGD). Using this test strategy, the IC chip under test is simply connected in the system IC, which in this case is the reference IC, and the system performance evaluated. This invention enables this strategy very effectively, and is the preferred test strategy.

Membrane test apparatus of the kind just described have proved very effective for testing digital IC devices. However, as indicated earlier, they are less effective for testing high-speed analog devices. This is largely due to the fact that the test signals and the output signals from the device under test are required to traverse a long path from the recording instruments and the reference IC devices, through the cable 28, along the membrane 18, to the test contact array 34, and back again. Due to this lengthy electrical path, high frequency test signals, inputs and outputs, may be seriously degraded and delayed, resulting in failure to properly evaluate the IC performance of the device under test. In testing RF functions, reference devices typically include inductors and capacitors, and the test signals for these components are especially vulnerable to stray or parasitic capacitances and inductances.

According to the invention the high frequency reference elements, i.e. the L,C impedance matching elements, are located near the I/O locations of the IC chip under test. Three alternatives for reaching this goal are shown in FIGS. 3–6.

Figure 3:
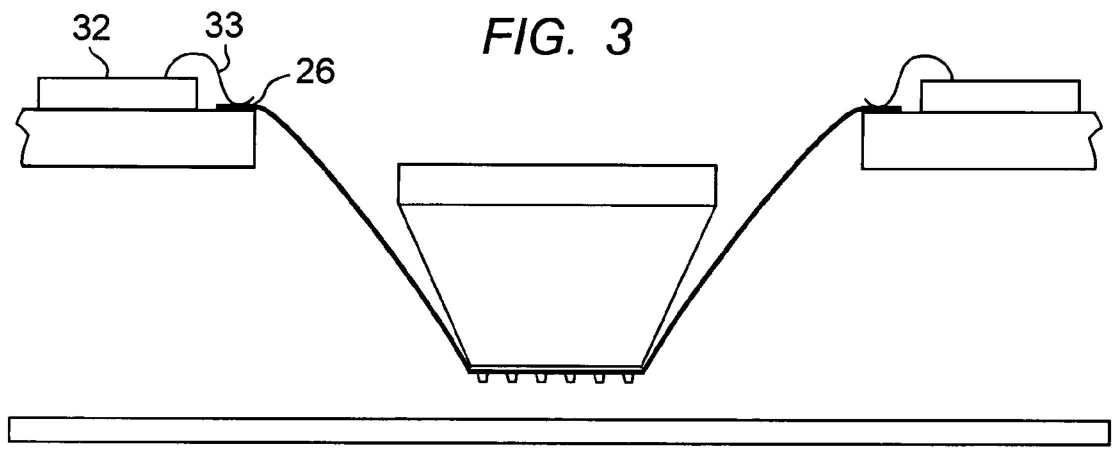
FIGS. 3–6 are views similar to those of FIGS. 1 and 2 showing different embodiments of the invention.

FIG. 3 shows reference IC 32 located on the membrane support structure 29, and closely adjacent to the edge of the support 29. The reference IC device(s) is interconnected to the terminals 26 by suitable interconnections. These interconnections are shown schematically as wire bonds 33, but it should be understood that the wire bonds illustrated are symbolic of any appropriate short electrical connection. Recognizing that the terminal arrangement 26 will change depending on the IC chip under test and the membrane configuration adapted for that chip under test, the preferred interconnections 33 will allow for temporary installation. However, a useful option is to permanently attach the reference IC directly to the membrane that matches that reference IC. Alternatively, the reference IC device or devices may be removably installed on the support 29. FIG. 3 shows two reference IC devices, one on each side of the opening for the membrane. Reference IC devices may also be installed on all four sides. This allows convenient routing of the interconnections between the reference IC devices and the terminals 26. It also allows the option to eliminate terminals 26 and use continuous runners between the reference IC chip and the contact probe array 34.

Figure 4:
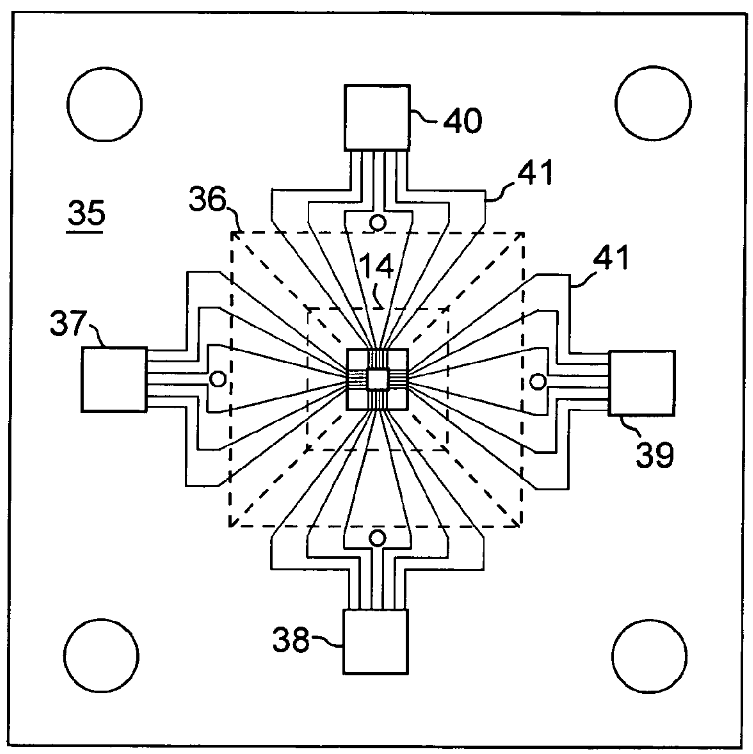

A probe membrane for implementing this option is shown in FIG. 4. Here the probe membrane 35 is constructed large enough to carry IC reference chips 37–40. The outline of the pyramid, or portion that is depressed by plunger 14, is shown by dashed line 36. The printed circuit runners in this embodiment are continuous from the IC reference chips to the probe contact array.

The actual length of the address runners from the IC reference chip to the probe contact array includes the portion along the sidewalls 18 of the pyramid (FIG. 2), which is relatively fixed in this embodiment, and the portion 41 extending along the surface of the support 29. It is preferred that the latter have a maximum length of less than twice the length of the runner that extends along the sidewall. This prescription holds for the runner length in general, whether the IC reference chip is mounted on the polymer membrane, or is mounted elsewhere on the support 29. The prescription is mainly intended for runners that interconnect L,C circuit elements.

Whereas four IC reference chips are shown in FIG. 4, similar results may be obtained with fewer reference chips, or one reference chip. Because the routing in this case is more complex, some of the runners may be substantially longer than others. The objective of the invention may still be realized in this case by routing the more sensitive runners, i.e. those that interconnect L,C components, along the short path, and assigning the longer paths to less sensitive components, e.g., digital components or transistors. It is desirable that timing sensitive runners are made with approximately equal length.

Figure 5:
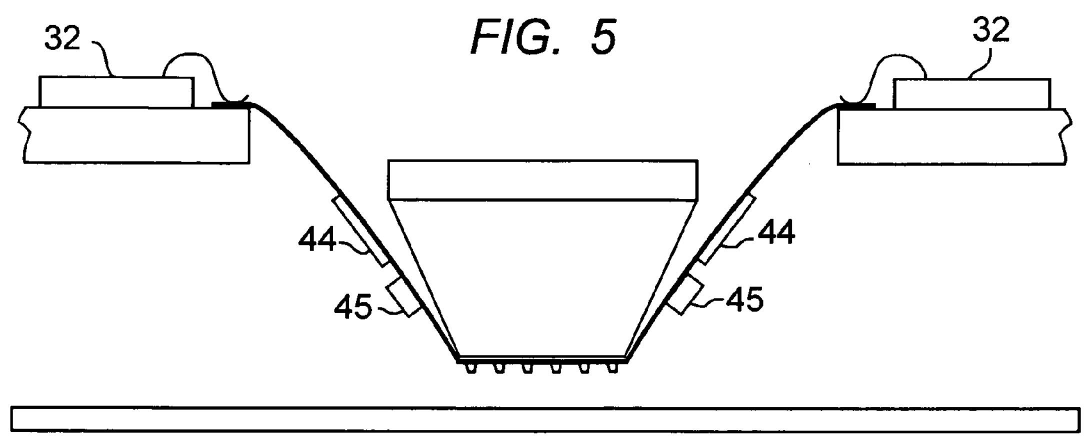

An even more effective arrangement for reducing the electrical path of the test vectors is shown in FIG. 5. Here the reference circuit is divided, with some components located directly on the sidewalls of the probe membrane, and other components located as in FIG. 3. The figure shows inductors 44 and capacitors 45 mounted on the sidewalls of the membrane as shown. These passive circuit elements are representative of components that may be selected for optimized test signal length. Other circuit elements may be chosen for this location. In this embodiment the IC reference chip 32 for the overall system is shown mounted according to the embodiment of FIGS. 3 and 4, with only selected device components removed to the sidewall of the membrane. The reference L,C elements 44, 45 are shown as separate elements for illustration but may be integrated on a silicon or ceramic chip. The chip may then contain all of the elements necessary for matching the I/Os of the chip under test. Several chips, e.g. four chips one on each side of the pyramid, may contain the impedance matching elements for each of four rows of I/Os on the chip under test. The elements integrated on the silicon or ceramic chip may comprises just L and/or C elements, which is referred to herein as a passive IC chip, or may comprise active elements such as transistors, and is referred to here and below as an active IC chip. The term IC chip may refer to either or both.

Figure 6:
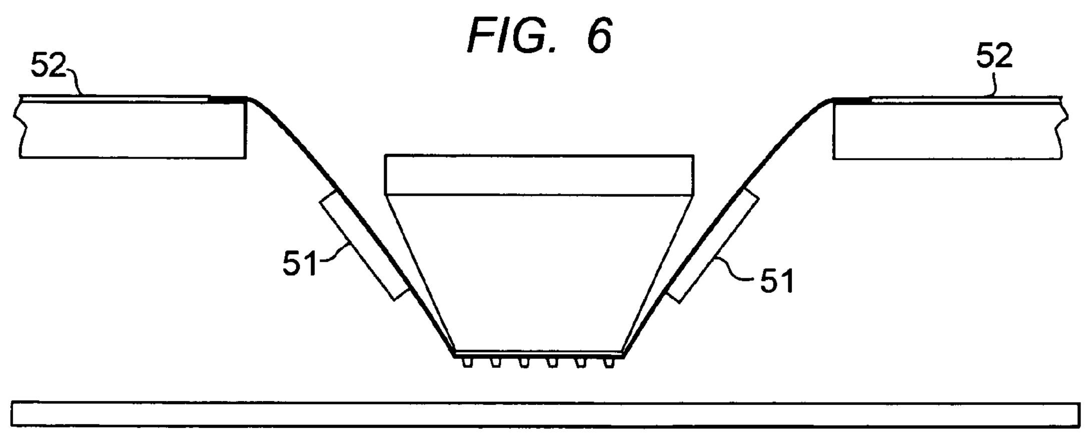

FIG. 6 shows the most optimum arrangement, wherein the entire system chip 51, containing both the reference L,C elements and other components such as transistors, is located on the sidewall of the membrane. The site occupied by the reference IC chip in FIG. 5 contains simply a runner 52 for routing test signal results from the reference IC chip(s) 51 to the main display or recorder. Again, the arrangement shown in FIG. 4, with four reference chips, each mounted on one of the four sides of the truncated pyramid 36 (FIG. 4), is convenient. The same strategy may be used for the interconnections. As in the earlier case, arrangements may be devised that use fewer reference chips, or a single reference chip.

Another advantage of having reference components or reference IC chips attached directly to the probe membrane is that all test information for a given chip type can be stored and retrieved as a single unit. There is no separate programming of test equipment when the device under test is changed. It is only necessary to install the probe membrane associated with that device.

As stated at the outset, the term reference IC chip refers to the test circuit that is part of the IC test apparatus. The apparatus may comprise one or more reference IC chips in the reference circuit. The term reference component is intended to refer to a component of the reference circuit, which component is a part but not the whole of the reference circuit. The reference component may be an inductor or capacitor, or the like, or a sub-circuit containing two or more of these elements. As stated earlier, the function of the reference component is to match the impedance of the I/Os of the chip under test, or to perform control the center frequency, i.e. a tank circuit. Similar components, such as capacitors, may be used for noise control in the address lines but are not to be confused with the impedance matching elements. Thus “reference component” as used herein and below in the context of analog device testing is defined as at least one an impedance matching element, and includes two or more impedance matching elements such as an L,C circuit. Two or more L,C circuits may be integrated on a silicon or ceramic chip for convenience. A “reference IC chip” is defined as an IC chip having an L,C impedance matching circuit, a balum transformer, a tank circuit, or similar reference components, and may contain additional components such as transistors.

It was pointed out earlier that although the invention is described mainly in the context of testing high frequency analog IC chips, it is applicable also to high speed digital IC chips. In this case the most promising approach is the embodiment represented by FIG. 6, wherein the reference circuit is a system level IC chip that at least partially replicates the functions of the IC chip under test. It will be recognized by those skilled in the art that the test circuits or “reference IC chips” in this case will be primarily high speed digital transistor circuits and the “reference components” will be primarily high speed digital transistor devices.

Following the embodiments represented by FIGS. 5 and 6, the reference components are located on the polymer membrane close to the probe contact array 34. This may be described as reference components or reference ICs attached to the polymer membrane at a position adjacent the probe contact array. This location is between the edge of the rigid support and the probe contact array.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. An IC test apparatus comprising:

a. a rigid support member having an opening therein, thereby defining a peripheral edge around the opening, b. a polymer membrane attached to the rigid support member and having a center portion covering the opening, c. a probe contact array on the center portion of the polymer membrane, d. a wafer platform, e. means for depressing the center portion of the polymer membrane toward the wafer platform, f. at least one reference IC chip located adjacent to the peripheral edge of the opening in the rigid support, g. interconnection means interconnecting the reference IC chip and the probe contact array.

2. The apparatus of claim 1 wherein the reference IC chip includes at least one LC circuit.

3. The apparatus of claim 1 wherein the opening has four sides, the apparatus further comprising a first reference IC chip located adjacent one side and a second IC reference chip located adjacent another side.

4. The apparatus of claim 1 further including at least one reference component attached to the polymer membrane adjacent to the probe contact array.

5. The apparatus of claim 4 wherein the reference component comprises an LC circuit.

6. An IC test apparatus comprising:

a. a rigid support member having an opening therein, thereby defining a peripheral edge around the opening, b. a polymer membrane attached to the rigid support member and having a center portion covering the opening, c. a probe contact array on the center portion of the polymer membrane, d. a wafer platform, e. means for depressing the center portion of the polymer membrane toward the wafer platform, f. a reference IC chip attached to the polymer membrane and located adjacent to the probe contact array, and g. interconnection means interconnecting the reference IC chip and the probe contact array.

7. The apparatus of claim 6 wherein the reference IC chip comprises a passive IC chip.

8. The apparatus of claim 6 wherein the reference IC chip comprises an active IC chip.

9. A method for testing an IC wafer comprising:

a. mounting a probe membrane on a rigid support member, the rigid support member having an opening therein, and the probe membrane attached to the rigid support member with a center portion thereof covering the opening, the center portion including both a probe contact array and a reference IC, b. mounting a wafer under test on a platform under the opening, c. moving the center portion of the probe membrane so that the probe contact array comes into contact with the wafer under test, and d. passing electrical test signals between I/Os on the wafer under test and a test circuit.

10. The method of claim 9 wherein the I/Os on the wafer under test and the reference IC comprise a fully functional system.

* * * * *